(12) United States Patent
Lee

(10) Patent No.: US 8,895,161 B2
(45) Date of Patent: Nov. 25, 2014

(54) FERROMAGNETIC GRAPHENES AND SPIN VALVE DEVICES INCLUDING THE SAME

(75) Inventor: Sung-Hoon Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 213 days.

(21) Appl. No.: 13/483,879

(22) Filed: May 30, 2012

(65) Prior Publication Data

US 2012/0308846 A1 Dec. 6, 2012

(30) Foreign Application Priority Data

Jun. 1, 2011 (KR) ........................ 10-2011-0052998

(51) Int. Cl.
| | | |
|---|---|---|
| *H01L 43/10* | (2006.01) | |
| *G11C 11/16* | (2006.01) | |
| *G11B 5/39* | (2006.01) | |
| *G01R 33/09* | (2006.01) | |
| *B82Y 30/00* | (2011.01) | |
| *H01F 10/00* | (2006.01) | |
| *H01F 41/30* | (2006.01) | |
| *H01L 29/16* | (2006.01) | |

(52) U.S. Cl.
CPC .............. *G01R 33/093* (2013.01); *H01L 43/10* (2013.01); *H01F 41/306* (2013.01); *G11C 11/161* (2013.01); *G11B 5/3903* (2013.01); *G11B 5/398* (2013.01); *B82Y 30/00* (2013.01); *H01F 10/005* (2013.01); *H01L 29/1606* (2013.01)
USPC ........................................ 428/811; 428/811.4

(58) Field of Classification Search
None
See application file for complete search history.

(56) References Cited

U.S. PATENT DOCUMENTS

| 8,440,331 | B2* | 5/2013 | Liu ............................... 428/828 |
|---|---|---|---|
| 8,563,965 | B2* | 10/2013 | Bowers et al. .................. 257/29 |
| 2009/0174435 | A1 | 7/2009 | Stan et al. |
| 2010/0102292 | A1 | 4/2010 | Hiura et al. |
| 2010/0109712 | A1* | 5/2010 | Zaliznyak et al. ............ 327/100 |
| 2011/0149670 | A1* | 6/2011 | Heo et al. .................... 365/225.5 |
| 2011/0274928 | A1* | 11/2011 | Liu ............................... 428/402 |
| 2012/0063033 | A1* | 3/2012 | Gurney et al. ............. 360/234.3 |
| 2013/0048952 | A1* | 2/2013 | Chen et al. ....................... 257/29 |

FOREIGN PATENT DOCUMENTS

| KR | 10-2009-0129298 A | 12/2009 |
|---|---|---|
| KR | 10-2010-0112726 A | 10/2010 |
| KR | 10-2010-0112727 A | 10/2010 |
| KR | 10-2010-0112728 A | 10/2010 |

OTHER PUBLICATIONS

Chen, Y. et al., "Resonant Transmission in Three-Terminal Triangle Graphene Nanojunctions with Zigzag Edges", Solid State Communications, 2010, pp. 675-679, vol. 150.
Son, et al., "Half-metallic graphene nanoribbons," Nature, vol. 444, pp. 347-349 (Nov. 16, 2006).
Son, et al., "Energy Gaps in Graphene Nanoribbons," Phys. Rev. Lett., vol. 97, 216803, (Nov. 22, 2006).

* cited by examiner

Primary Examiner — Kevin Bernatz
(74) Attorney, Agent, or Firm — Harness, Dickey & Pierce, P.L.C.

(57) ABSTRACT

A ferromagnetic graphene includes at least one antidot such that the ferromagnetic graphene has ferromagnetic characteristics. A spin valve device includes a ferromagnetic graphene. The ferromagnetic graphene includes a first region, a second region, and a third region. At least one antidot is formed in each of the first region and the third region. The first region and the third region are ferromagnetic regions, whereas the second region is a non-ferromagnetic region.

16 Claims, 9 Drawing Sheets

FERROMAGNETIC GRAPHENES AND SPIN VALVE DEVICES INCLUDING THE SAME

CROSS-REFERENCE TO RELATED APPLICATIONS

This application claims priority under 35 U.S.C. §119 to Korean Patent Application No. 10-2011-0052998, filed on Jun. 1, 2011, in the Korean Intellectual Property Office, the disclosure of which is incorporated herein in its entirety by reference.

BACKGROUND

1. Field

Example embodiments relate to ferromagnetic graphenes and spin valve devices, for example, ferromagnetic graphenes including one or more antidots and spin valve devices including ferromagnetic graphenes.

2. Description of the Related Art

A graphene having a 2-dimensional hexagonal carbon structure is a material that may be an alternative to conventional semiconductors. A graphene is a zero-gap semiconductor. Also, because a graphene has a relatively high carrier mobility of about 100,000 $cm^2V^{-1}s^{-1}$ at room temperature, which is about 100 times higher than that of conventional silicon, the graphene may be applied to devices that operate at relatively high speeds (e.g., radio frequency (RF) devices).

If a graphene is cut to have an armchair edge, the graphene is non-magnetic. If a graphene has a zigzag edge, a net magnetic moment is about zero due to antiferromagnetic coupling.

A conventional spin valve device includes two or more conductive magnetic materials, and an electrical resistance of the conventional spin valve device varies according to spin directions of the conductive magnetic materials. In one example, a giant magnetoresistance effect may show this phenomenon. When spins of magnetic material layers are in a parallel alignment, a resistance to electrons passing through the magnetic material layers is relatively low. By contrast, when spins of the magnetic material layers are in an antiparallel alignment, a resistance to electrons passing through the magnetic material layers is relatively high.

Conventional spin valve devices may be applied to, for example, magnetic sensors, write heads of hard discs, magnetic random access memories (MRAMs), and so on.

In order to utilize a graphene in conventional spin valve devices, the graphene should be ferromagnetic.

SUMMARY

At least some example embodiments provide ferromagnetic graphenes including one or more antidots, and spin valve devices including ferromagnetic graphenes.

At least one example embodiment provides a ferromagnetic graphene having at least one antidot such that the graphene has ferromagnetic characteristics. At least one other example embodiment provides a ferromagnetic graphene having at least one antidot, the graphene having ferromagnetic characteristics.

According to at least some example embodiments, the at least one antidot may have a triangular or hexagonal shape. The hexagonal shape may have three first sides and three second sides. Each of the three first sides may have a given, desired or predetermined first length, whereas each of the three second sides may have a given, desired or predetermined second length. Lengths of each of the three second sides may be less than the lengths of the three first sides. The three first sides and the three second sides may be formed alternately. Each of the three first sides and the three second sides may have at least one zigzag edge.

The triangular shaped antidot may have three sides. Each of the three sides may have at least one zigzag edge and at least one armchair edge.

An aperture ratio of the at least one antidot relative to the ferromagnetic graphene may be between about 20% and about 80%, inclusive.

The ferromagnetic graphene may include a first region, a second region, and a third region. The first, second and third regions may be sequentially connected to one another. Each of the first region and the third region may be ferromagnetic and include at least one antidot. The second region may be non-ferromagnetic. The first region may have ferromagnetic properties greater than the ferromagnetic properties of the third region. An area of the at least one antidot in the first region may be greater than an area of the at least one antidot in the third region. An aperture ratio of the at least one antidot in each of the first region and the third region may be between about 20% and 80%, inclusive.

At least one other example embodiment provides a spin valve device including a ferromagnetic graphene. The ferromagnetic graphene includes a first region, a second region, and a third region. Each of the first region and the third region has at least one antidot.

According to at least some example embodiments, the first, second, and third regions may be sequentially connected to one another.

The spin valve device may further include a first electrode and a second electrode that are respectively connected to the first region and the third region. The spin valve device may be configured such that spin electrons are introduced in a first direction through the first electrode, and such that a magnetic resistance is measured from a number of spin electrons passing through the second region.

BRIEF DESCRIPTION OF THE DRAWINGS

Example embodiments will become apparent and more readily appreciated from the following description of the accompanying drawings in which.

DETAILED DESCRIPTION

Figure 1:
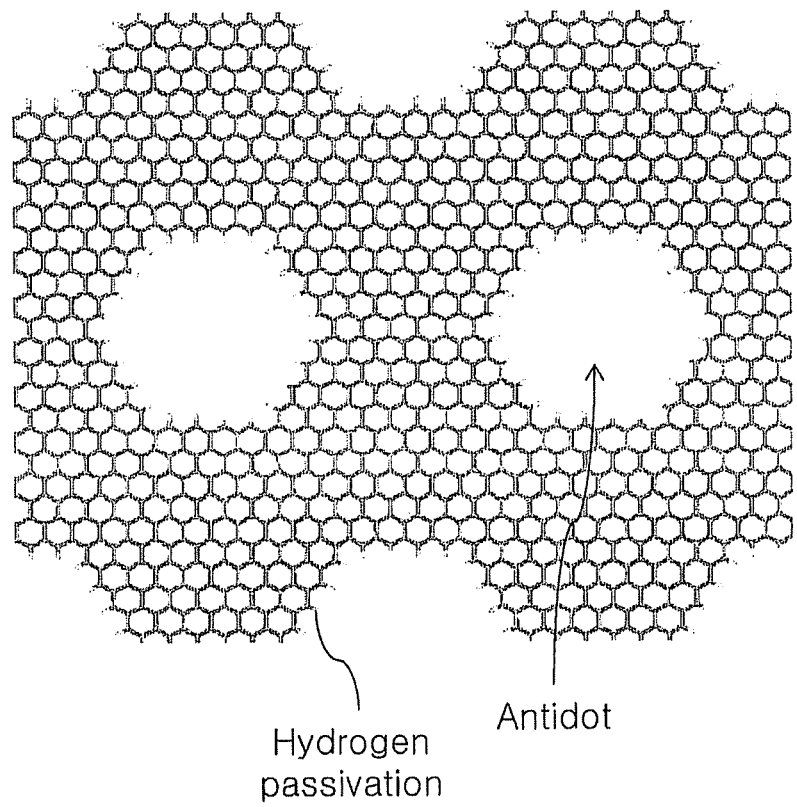
FIG. 1 is a view illustrating atoms of an example graphene having hexagonal antidots.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a view illustrating atoms of a graphene having hexagonal antidots.

Referring to FIG. 1, hexagonal vacancy defects are formed in the graphene. The vacancy defects are called antidots. Each of the antidots illustrated in FIG. 1 has a regular hexagonal shape. As shown, each of the antidots has 6 sides, each of the 6 sides has 4 edges, and each of the 6 sides is the same or substantially the same length. Each of the antidots has zigzag edges, and ends of the zigzag edge are passivated with hydrogen.

Figure 2:
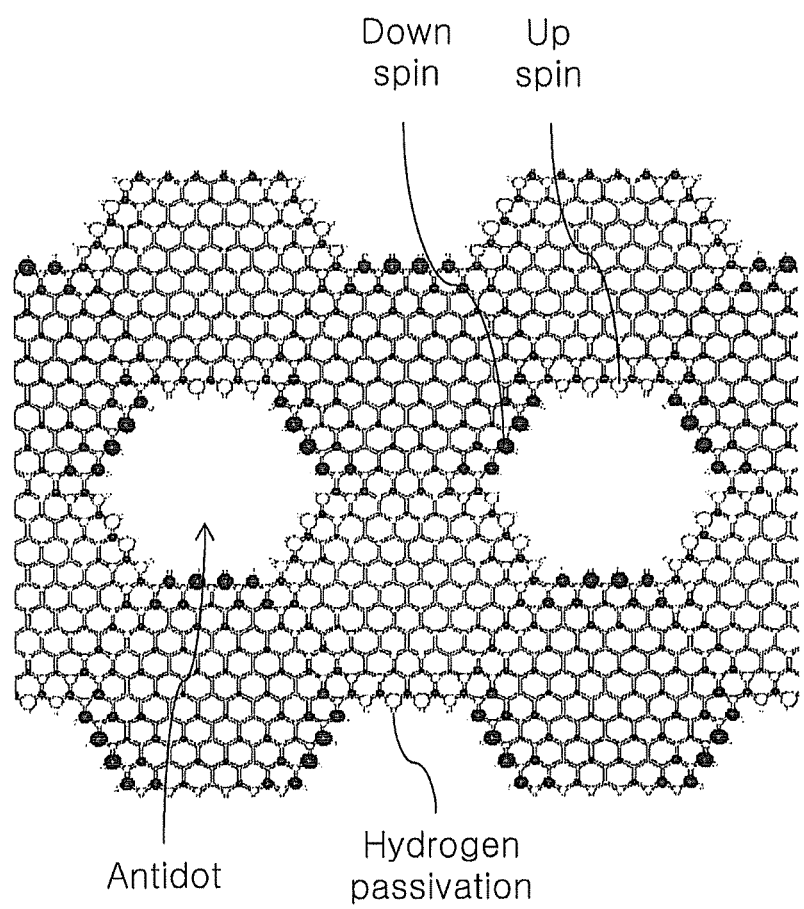
FIG. 2 illustrates a spin density of the example graphene having the hexagonal antidots of FIG. 1.

FIG. 2 illustrates an example result of a simulation for obtaining a spin density of the graphene having the hexagonal antidots of FIG. 1. The simulation was performed based on a density-function theory.

In FIG. 2, down spin electrons are illustrated as circles covered by black (referred to as black circles hereinafter), whereas up spin electrons are illustrated as circles covered by white (referred to as white circles hereinafter).

Referring to FIG. 2, magnetic properties of spin electrons at edges of an antidot are greater than magnetic properties of spin electrons at other regions because a magnetic moment of the spin electrons at the edges of the antidot is relatively strong. Edges of each side are filled with any one of up spin electrons and down spin electrons, and spin electrons of different directions are filled in edges of adjacent sides. In the example shown in FIGS. 1 and 2, adjacent sides of the antidot are filled with different spin electrons (e.g., up spin electrons or down spin electrons). As a result, a net magnetic moment of the graphene including the regular hexagonal antidots is about zero due to antiferromagnetic coupling at the zigzag edges.

Magnetic devices (e.g., spin-valve or other devices) may utilize ferromagnetic graphenes having antidots (e.g., hexagonal and/or triangular antidots).

Figure 3:
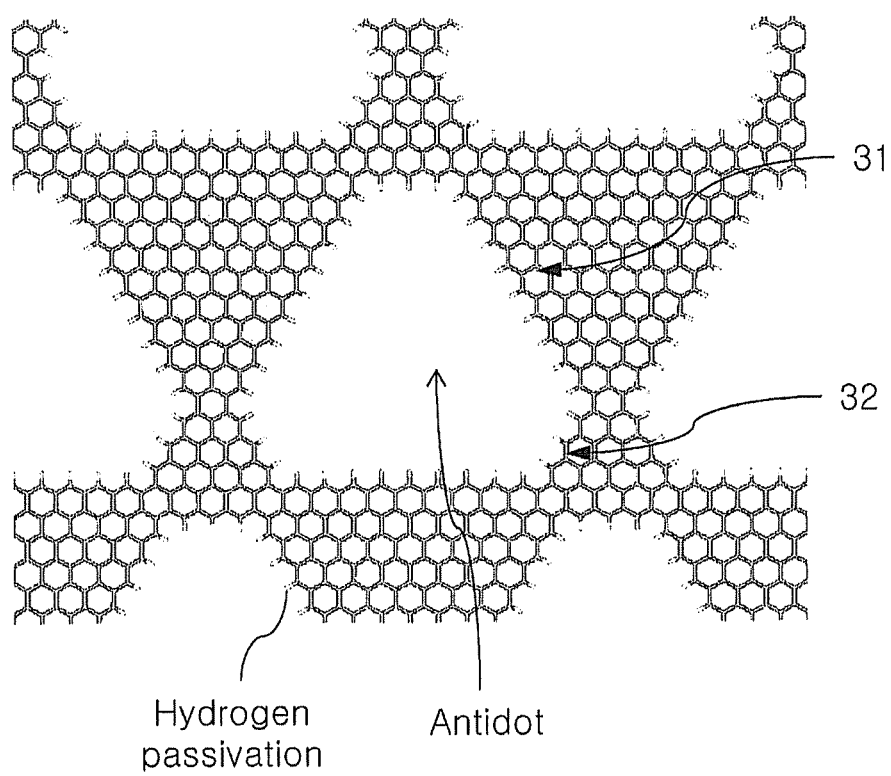
FIG. 3 is a view illustrating a ferromagnetic graphene according to an example embodiment.

FIG. 3 is a view illustrating a ferromagnetic graphene according to an example embodiment.

Referring to FIG. 3, the graphene includes a plurality of hexagonal antidots. Although the plurality of hexagonal antidots have the same or substantially the same size in FIGS. 3 and 4, example embodiments are not limited thereto. Rather, the graphene may include a plurality of hexagonal antidots having different sizes.

In each of the plurality of hexagonal antidots, three first sides 31 and three second sides 32 are formed alternately. In this example, adjacent sides of the antidot maintain an angle of about 120 degrees therebetween. The three first sides 31 have a first length, whereas the three second sides have a second length. In this example, the three first sides 31 have a length that is greater than the three second sides 32. Each of the sides of the antidots shown in FIG. 3 has zigzag edges, and ends of the zigzag edges are passivated with hydrogen.

Figure 4:
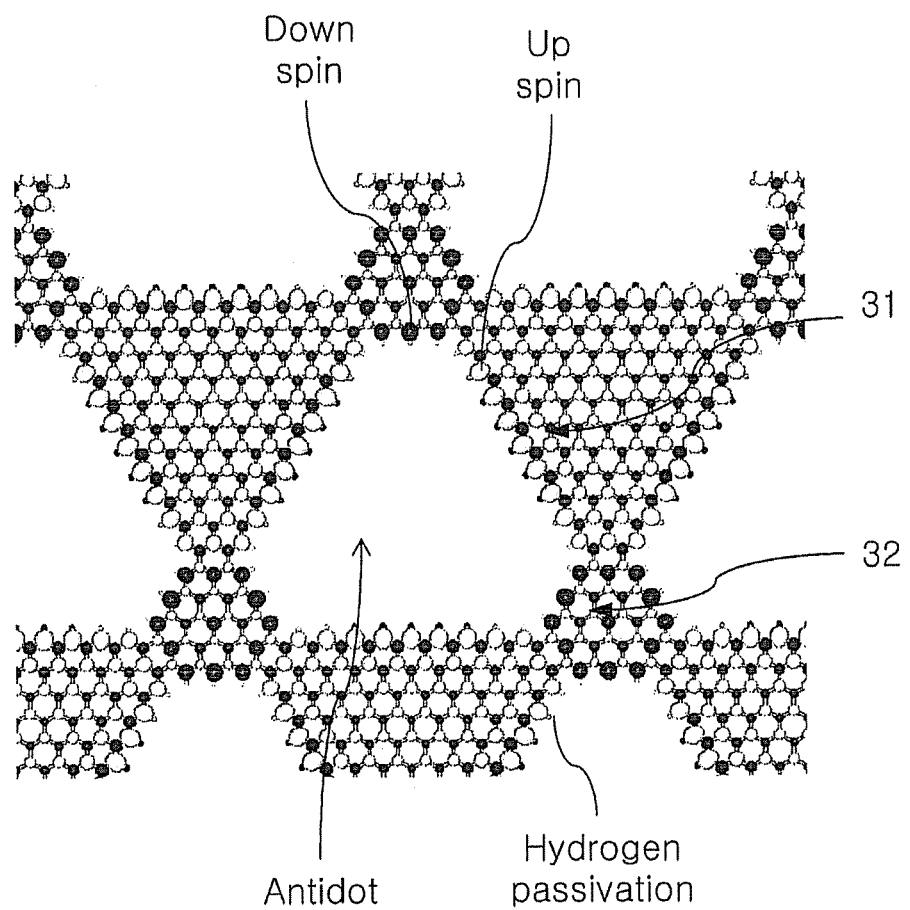
FIG. 4 is a view illustrating a spin density of the ferromagnetic graphene of FIG. 3.

FIG. 4 is a view illustrating an example result of a simulation for obtaining a spin density of the ferromagnetic graphene of FIG. 3.

In FIG. 4, up spin electrons are illustrated as white circles, and down spin electrons are illustrated as black circles.

Referring to FIG. 4, edges of each of the first sides 31 and the second sides 32 are filled with any one of up spin electrons and down spin electrons. In FIG. 4, the edges of the first sides 31 are filled with the up spin electrons, whereas the edges of the second sides 32 are filled with the down spin electrons. Accordingly, in at least this example embodiment, the up spin electrons have greater ferromagnetic properties in the hexagonal antidots, and thus, in at least this example, the graphene having the hexagonal antidots is ferromagnetic (e.g., has ferromagnetic characteristics and/or properties).

Referring back to FIGS. 3 and 4, 9 edges of each of the first sides 31 are filled with up spin electrons, whereas the 3 edges of each of the second sides 32 are filled with down spin electrons. A magnetic moment of each of the hexagonal antidots may be defined by Equation (1) shown below.

$$M = (NA - NB) \quad \text{Equation (1)}$$

In Equation (1), NA refers to the number of up spin electrons at the first side 31 of each of the antidots, and NB refers to the number of down spin electrons at the second side 32 of each of the antidots. A unit of the magnetic moment is a Bohr magneton $\mu_B$). In FIG. 4, since NA is 9 and NB is 3, M is $6\mu_B$.

According to Equation (1), as a difference between numbers of spin electrons at the first sides 31 and the second sides 32 increases, a magnetic moment increases. If numbers of up spin electrons at the first sides 31 and down spin electrons at the second sides 32 are the same, then a net magnetic moment is zero or substantially zero as with a graphene having zigzag edges, as shown in FIGS. 1 and 2.

According to at least some example embodiments, ferromagnetic properties of a graphene may be adjusted by adjusting a difference between sizes of first sides and second sides of hexagonal antidot of the graphene.

A ferromagnetic graphene according to at least this example embodiment may be used as a ferromagnetic material for a flexible substrate.

Figure 5:
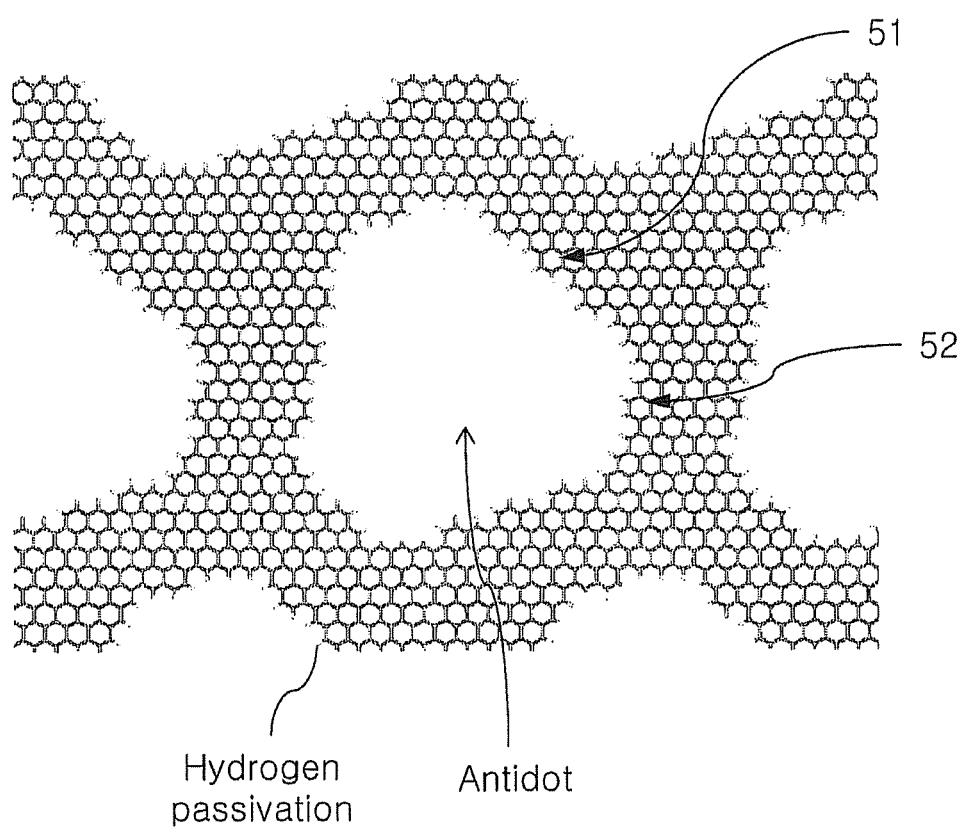
FIG. 5 is a view illustrating a ferromagnetic graphene according to another example embodiment.
Figure 6:
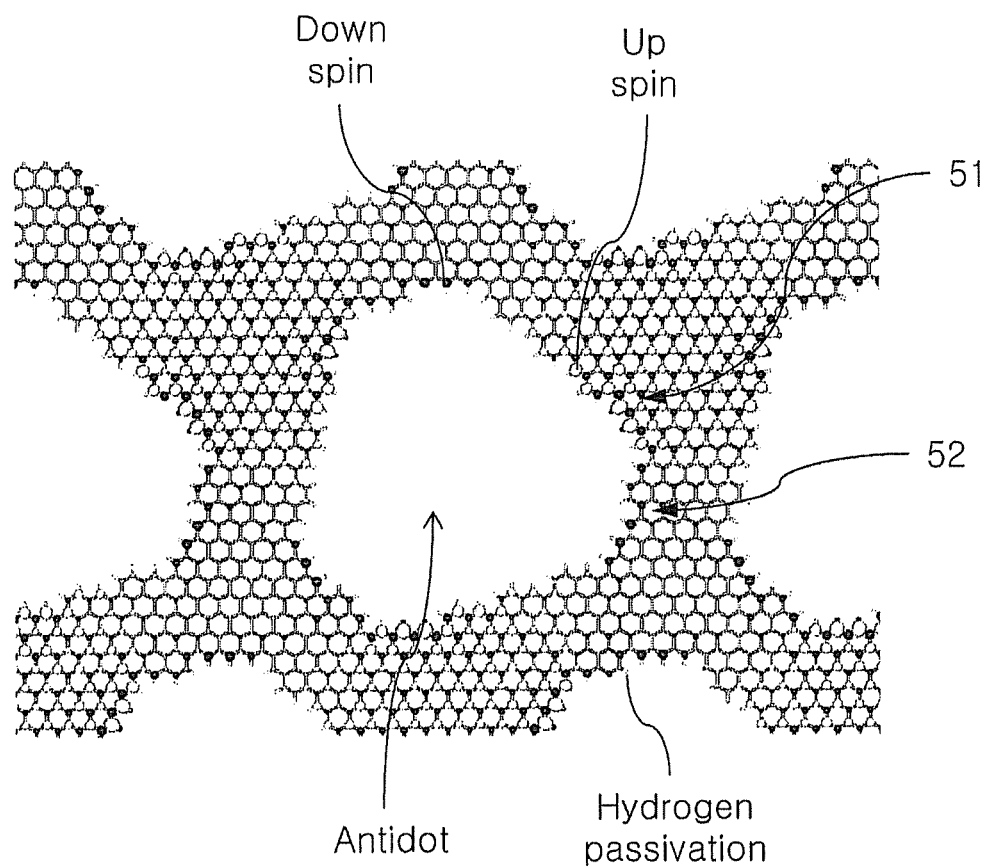
FIG. 6 is a view illustrating a spin density of the ferromagnetic graphene of FIG. 5.

FIG. 5 is a view illustrating a ferromagnetic graphene according to another example embodiment. FIG. 6 is a view illustrating a spin density of the ferromagnetic graphene shown in FIG. 5.

In FIGS. 5 and 6, a plurality of hexagonal antidots are formed in a graphene. Although the plurality of hexagonal antidots have the same or substantially the same or substantially the same size, example embodiments are not limited thereto. Rather, the graphene may include a plurality of hexagonal antidots having different sizes.

Referring to FIG. 5, each of the hexagonal antidots has three first sides 51 and three second sides 52 formed alternately. The first sides 51 have a first length, and the second sides have a second length. The first length is longer than the second length. In this example, the edges of each side of the antidot are passivated with hydrogen. At the first side 51 of the hexagonal antidot, zigzag edges and armchair edges are formed so as to be connected to each other. At the second side 52 of the hexagonal antidot, zigzag edges and armchair edges are formed so as to be connected to each other. When the hexagonal antidot is patterned, each side may not have accurate zigzag edges, thereby partially having armchair edges.

In FIG. 6, up spin electrons are illustrated as white circles, and down spin electrons are illustrated as black circles.

Referring to FIG. 6, edges of the first and second sides 51 and 52 are filled with up spin electrons or down spin electrons. At each first side 51, there are 10 up spin electrons, and 2 down spin electrons. At each second side 52, there are 5 down spin electrons and 1 up spin electron. Accordingly, a magnetic moment is $4\mu_B$ obtained by subtracting a number (7) of the down spin electrons from a number (11) of the up spin electrons. Accordingly, in the graphene having the hexagonal antidots in the example embodiment shown in FIGS. 5 and 6, the up spin electrons have greater ferromagnetic properties.

Figure 7:
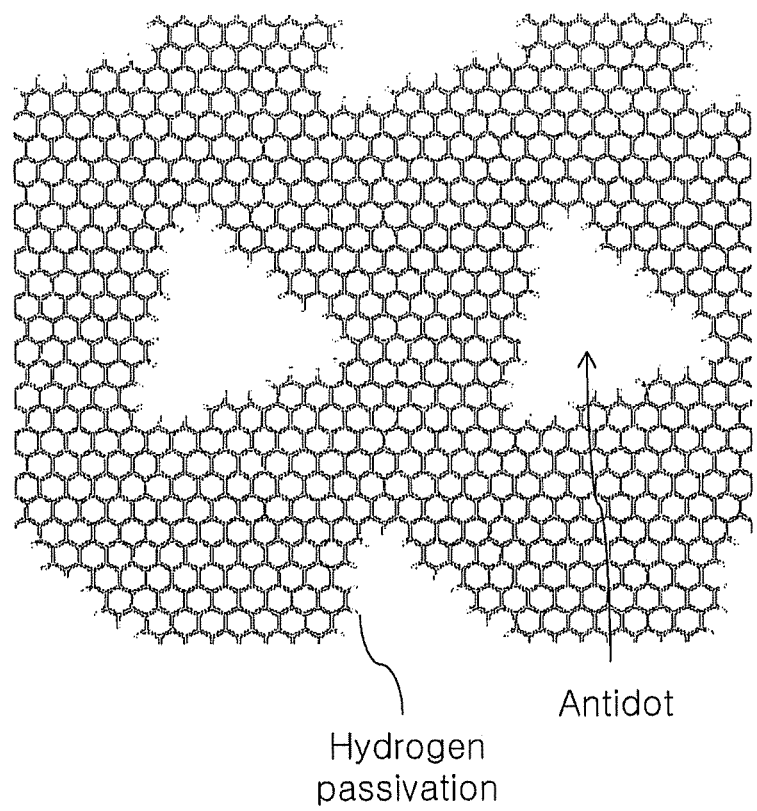
FIG. 7 is a view illustrating a ferromagnetic graphene according to still another example embodiment.
Figure 8:
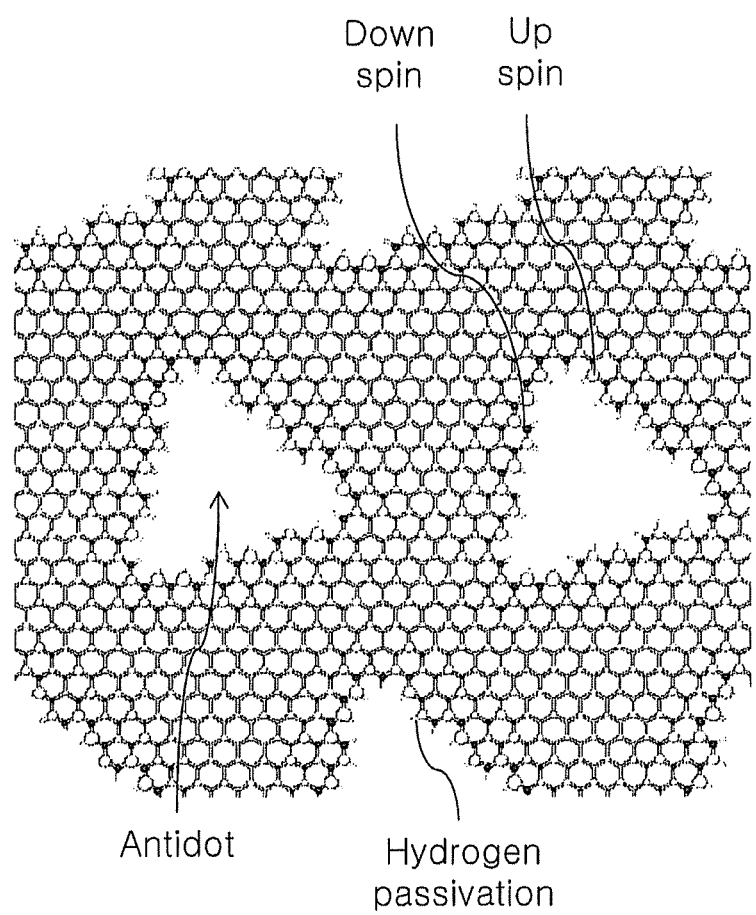
FIG. 8 is a view illustrating a spin density of the ferromagnetic graphene of FIG. 7.

FIG. 7 is a view illustrating a ferromagnetic graphene according to another example embodiment. FIG. 8 is a view illustrating a spin density of the ferromagnetic graphene of FIG. 7.

Referring to FIG. 7, the graphene includes a plurality of triangular antidots. Although the triangular antidots have the same or substantially the same size in FIGS. 7 and 8, example embodiments are not limited thereto. Rather, the triangular antidots may have different sizes. Alternatively, hexagonal antidots as shown in FIGS. 3 and 5 may be formed together in the graphene shown in FIG. 7.

Edges of each side of the triangular antidot are passivated with hydrogen. In each side of the triangular antidot, zigzag edges and armchair edges are formed so as to be connected to each other. When the triangular antidots are patterned, each side of the triangular antidot may not have an accurate zigzag edge, thereby resulting in each side partially having an armchair edge.

In FIG. 8, up spin electrons are illustrated as white circles, and down spin electrons are illustrated as black circles.

Referring to FIG. 8, edges of each side of the triangular antidot are filled with up spin electrons or down spin electrons. At each side of the triangular antidot, there are 6 up spin electrons and 3 down spin electrons. Thus, according to Equation 1, a magnetic moment of the triangular antidot is about $3\mu_B$. Accordingly, in the graphene having the triangular antidots, up spin electrons have greater ferromagnetic properties.

Figure 9:
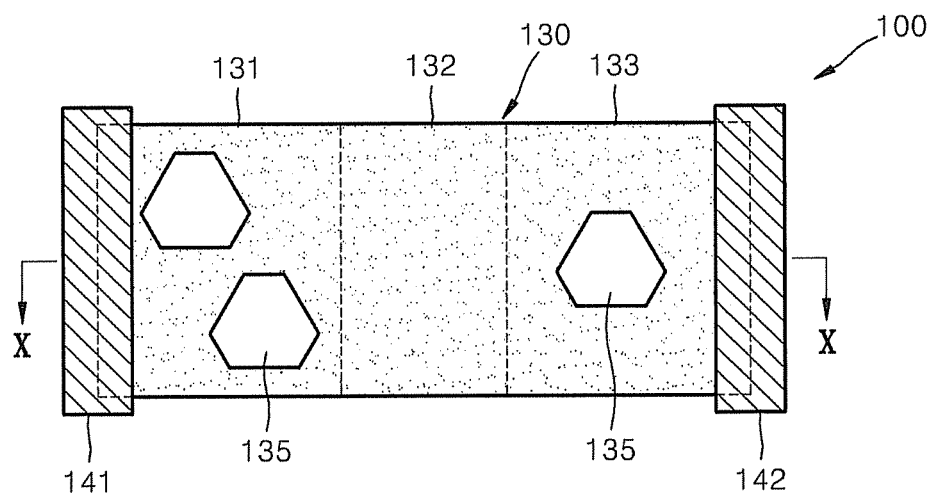
FIG. 9 is a plan view illustrating a spin valve device according to an example embodiment.
Figure 10:
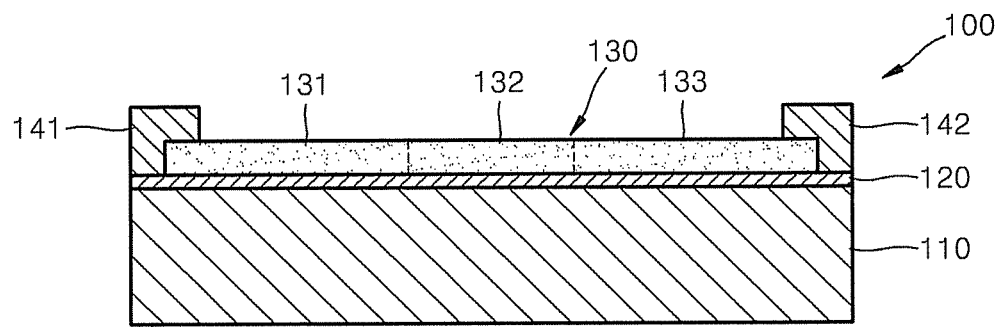
FIG. 10 is a cross-sectional view taken along line X-X of FIG. 9.

FIG. 9 is a plan view illustrating a spin valve device 100 according to an example embodiment. The spin valve device 100 includes a ferromagnetic graphene. FIG. 10 is a cross-sectional view taken along line X-X of FIG. 9.

Referring to FIGS. 9 and 10, an insulating layer 120 is formed on a substrate 110 (e.g., a silicon substrate). The insulating layer 120 may be a silicon oxide or similar layer. If the substrate 110 is an insulating substrate (e.g., a glass substrate or a plastic substrate), then the insulating layer 120 may be omitted.

A graphene 130 is disposed on the insulating layer 120. In the example embodiment shown in FIGS. 9 and 10, the graphene 130 is divided into first through third regions 131 through 133. Ferromagnetic antidots 135 are formed in the first region 131 and the third region 133 of the graphene 130. The ferromagnetic antidots 135 may be, for example, hexagonal antidots or triangular antidots as described above. Alternatively, both hexagonal antidots and triangular antidots may be formed in each of the first and third regions 131 and 133 of the graphene 130. The second region 132 of the graphene 130 is a non-magnetic region without antidots.

In the example embodiment shown in FIGS. 9 and 10, the first electrode 141 and a second electrode 142 are formed at ends of the first region 131 and the third region 133, respectively.

According to at least this example embodiment, the first region 131 and the third region 133 including the antidots 135 have ferromagnetic properties. But, ferromagnetic properties of the first region 131 and the third region 133 are different. For example, the ferromagnetic properties of the first region 131 may be greater than ferromagnetic properties of the third region 133. For example, a magnetic field needed to magnetize the first region 131 of the graphene 130 in one spin direction (e.g., an up spin direction) may be greater than a magnetic field needed to magnetize the third region 133 of the graphene 130 in the same spin direction. Accordingly, while it may be relatively difficult to change a spin direction by using an external magnetic field in the first region 131, a spin direction in the third region 133 may be changed more easily by an external magnetic field.

The second region 132 of the graphene 130, which is a region between the first region 131 and the third region 133, does not have an antidot formed therein.

According to at least some example embodiments, a ratio (referred to as an aperture ratio hereinafter) of an area occupied by antidots with respect to the first region 131 and the third region 133 of the graphene 130 may be between about 20% and about 80%, inclusive. If the aperture ratio is lower than about 20%, then ferromagnetic properties in a corresponding region may be relatively low. If the aperture ratio is higher than about 80%, then the graphene 130 in a corresponding region tends to be torn off relatively easily.

If a superior spin direction of the first region 131 and a superior spin direction of the third region 133 are the same, then the first region 131 and the third region 133 are in a parallel alignment. If a superior spin direction of the first region 131 and a superior spin direction of the third region 133 are different from each other, then the first region 131 and the third region 133 are in an anti-parallel alignment.

Each of the first electrode 141 and the second electrode 142 may be formed of a general electrode, as well as a ferromagnetic material such as iron (Fe), cobalt (Co), or nickel (Ni). When current is injected from the first electrode 141 to the second electrode 142, only spin electrons of the same direction as a direction of superior spin electrons in the first region 131 are introduced into the first region 131 and moved to the third region 133. In this case, if the third region 133 and the first region 131 are in a parallel alignment, then a resistance between the first electrode 141 and the second electrode 142 is reduced and current flows in one direction from the first electrode 141 to the second electrode 142 relatively easily. When the first region 131 and the third region 133 are in an anti-parallel alignment, a resistance between the first electrode 141 and the second electrode 142 increases and current does not flow from the first electrode 141 to the second electrode 142 relatively easily. Accordingly, whether the first region 131 and the third region 133 are in a parallel or anti-parallel alignment may be detected by measuring current between the first electrode 141 and the second electrode 142.

Spin valve devices according to at least some example embodiments may be applied to magnetic resistance devices, write heads of hard discs, magnetic random access memories (MRAMs), and so on.

Spin valve devices including ferromagnetic graphenes according to one or more example embodiments may more easily change a corresponding region of a graphene to a ferromagnetic region by forming antidots therein. Also, because ferromagnetic properties of the corresponding region may be adjusted by adjusting a number, a size, etc. of antidots, spin valve devices may be more easily applied to magnetic resistance devices such as magnetic resistance heads, magnetic resistance sensors, MRAMs, or the like.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A ferromagnetic graphene comprising:
at least one antidot in the ferromagnetic graphene, the ferromagnetic graphene having ferromagnetic characteristics, wherein the at least one antidot has a hexagonal shape having three first sides and three second sides formed alternately, each of the three first sides having a first length, and each of the three second sides having a second length, the second length being less than the first length.

2. The ferromagnetic graphene of claim 1, wherein each of the three first sides and the three second sides has at least one zigzag edge.

3. The ferromagnetic graphene of claim 1, wherein an aperture ratio of the at least one antidot relative to the ferromagnetic graphene is between about 20% and about 80%, inclusive.

4. The ferromagnetic graphene of claim 1, wherein the ferromagnetic graphene comprises:
a first region, a second region, and a third region, wherein each of the first region and the third region includes at least one antidot,
each of the first region and the third region has ferromagnetic properties, and
the second region is non-ferromagnetic.

5. The ferromagnetic graphene of claim 4, wherein the ferromagnetic properties of the first region are greater than the ferromagnetic properties of the third region.

6. The ferromagnetic graphene of claim 5, wherein an area of the at least one antidot in the first region is greater than an area of the at least one antidot in the third region.

7. The ferromagnetic graphene of claim 5, wherein an aperture ratio of the at least one antidot in each of the first region and the third region is between about 20% and about 80%, inclusive.

8. A spin valve device comprising:
a ferromagnetic graphene having a first region, a second region, and a third region, each of the first region and the third region including at least one antidot,
a first electrode connected to the first region; and
a second electrode connected to the third region, wherein the spin valve device is configured such that spin electrons are introduced in one direction through the first electrode, and such that a magnetic resistance is measured from a quantity of spin electrons passing through the second region.

9. The spin valve device of claim 8, wherein the at least one antidot has a triangular or hexagonal shape.

10. The spin valve device of claim 9, wherein the at least one antidot has the hexagonal shape having three first sides and three second sides formed alternately, each of the three first sides having a first length, and each of the three second sides having a second length, the second length being less than the first length.

11. The spin valve device of claim 10, wherein each of the three first sides and each of the three second sides has at least one zigzag edge.

12. The spin valve device of claim 9, wherein the at least one antidot has the triangular shape, and wherein the at least one antidot has at least one zigzag edge and at least one armchair edge.

13. The spin valve device of claim 8, wherein the first region and the third region are ferromagnetic, but the second region is non-ferromagnetic.

14. The spin valve device of claim 13, wherein the ferromagnetic properties of the first region are greater than the ferromagnetic properties of the third region.

15. The spin valve device of claim 14, wherein an area of the at least one antidot in the first region is greater than an area of the at least one antidot in the third region.

16. The spin valve device of claim 15, wherein an aperture ratio of the at least one antidot in each of the first region and the third region is between about 20% and about 80%, inclusive.

* * * * *